United States Patent [19]

Beitner

[11] Patent Number: 4,622,822
[45] Date of Patent: Nov. 18, 1986

[54] PELTIER THERMOELECTRIC ELEMENT MOUNTING

[76] Inventor: Shlomo Beitner, 3900 N. Lakeshore Dr., Ste. 14A, Chicago, Ill. 60613

[21] Appl. No.: 607,747

[22] Filed: May 7, 1984

[51] Int. Cl.$^4$ .......................... F25B 21/02; B25B 1/00
[52] U.S. Cl. ..................... 62/3; 269/254 R; 403/11
[58] Field of Search ............ 62/3; 403/11, 408.1, 403/337; 269/254 R

[56] References Cited

U.S. PATENT DOCUMENTS 3,307,035 2/1967 Grasenick et al. ......... 269/254 R X
4,097,036 6/1978 Henke ........................... 269/254 R

FOREIGN PATENT DOCUMENTS 978441 12/1964 United Kingdom .................. 62/3

Primary Examiner—William E. Wayner
Attorney, Agent, or Firm—Norman Lettvin

[57] ABSTRACT

In heating and cooling assemblages, that use a thermoelectric module of the Peltier type held tightly between heating and cooling members, an improvement, for avoiding fracture of the frangible components of the Peltier type thermoelectric module, is provided by using a clamping means, that acts against the members clamped against the thermoelectric module, that employs spring means that exert the assembly pressure against the thermoelectric module's substrates. The spring means desirably apply force in line with the central portion of the module's substrates, where the hottest portion of the module's substrate is located. The spring means employ one or more elongated leaf springs whose center is offset from the ends of the springs that are engaged by selectively actuatable clamping means. In one specific form a cooling box for use in the field is equipped with assemblages, as disclosed, provided at the corners of the box.

11 Claims, 11 Drawing Figures

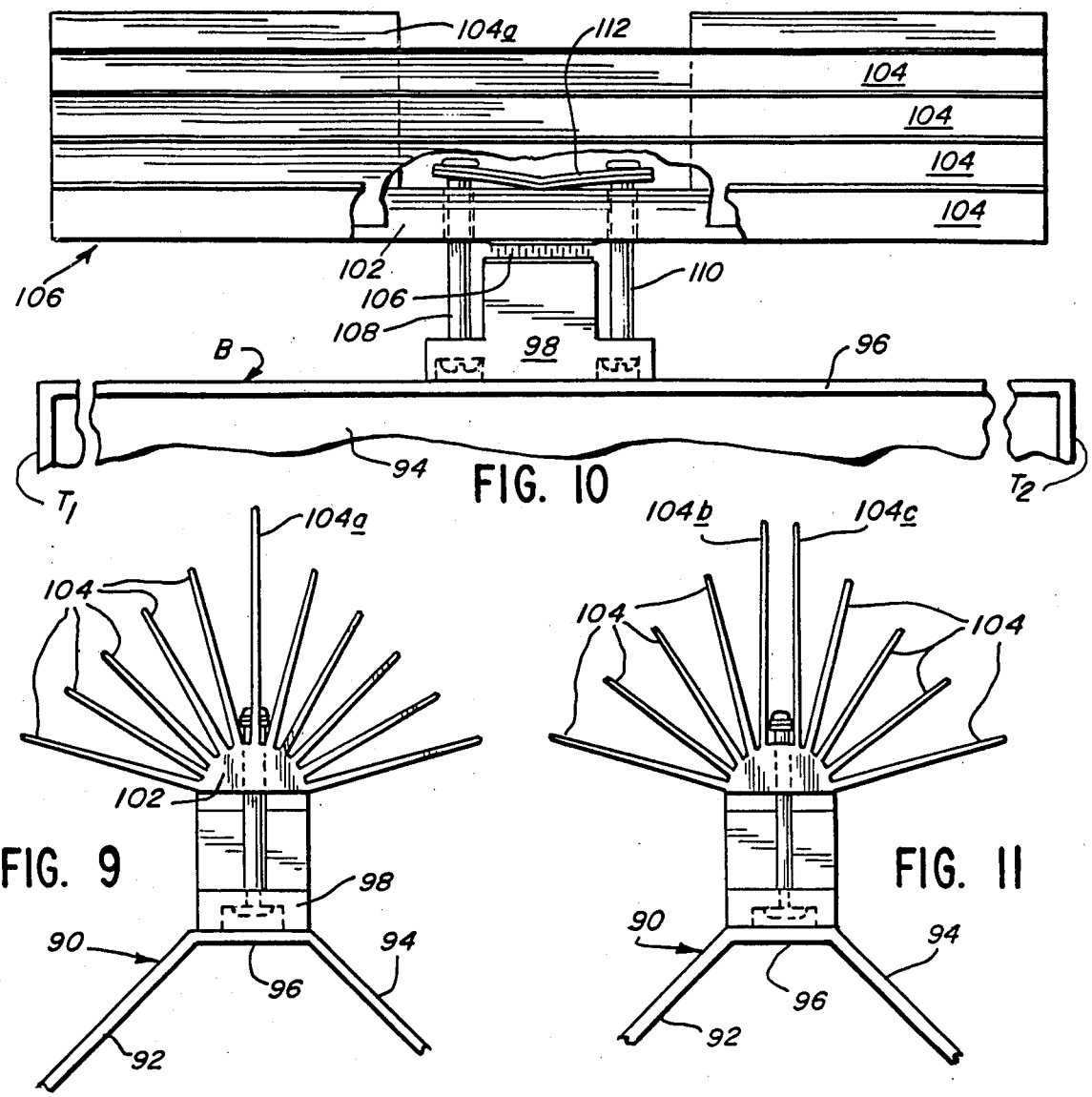
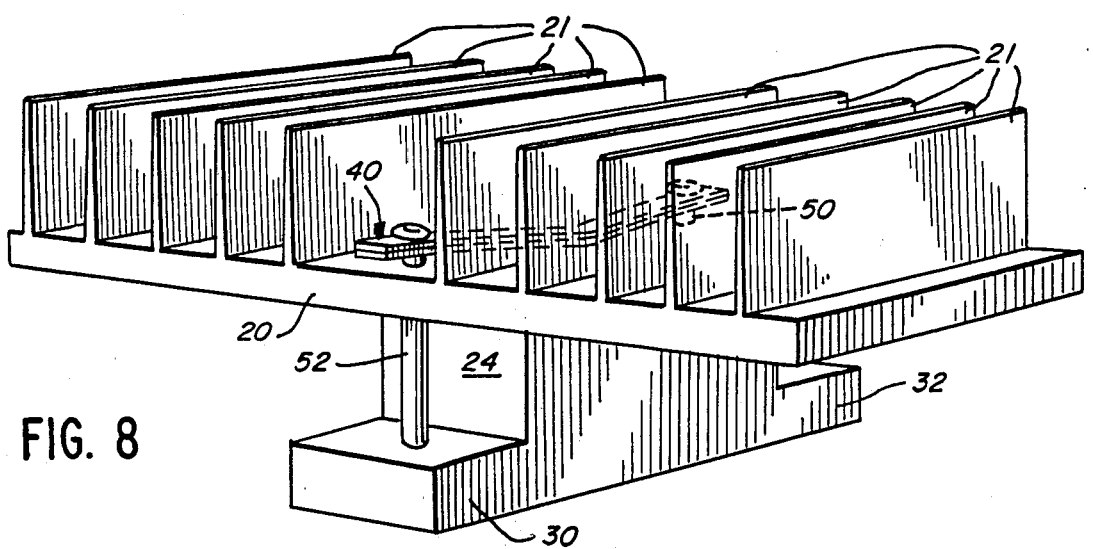

PELTIER THERMOELECTRIC ELEMENT MOUNTING

This invention relates to an improved mounting for a Peltier effect thermoelectric module.

BACKGROUND OF THE INVENTION

Thermoelectric modules of the Peltier type are used in applications where electric heating and cooling is desired, as disclosed, for example, in S. Beitner, U.S. Pat. Nos. 4,092,138; 4,107,934; and 4,143,711. Such thermoelectric modules comprise current carrying elements having hot and cold junctions sandwiched between a pair of flat parallel sheets, or substrates, constructed of $Al_2O_3$, or a similar material having relatively low electrical conductivity and relatively high thermal conductivity.

The thermoelectric module is ordinarily mounted between spaced thermal conducting members having parallel planar surfaces as shown in FIG. 3 of both U.S. Pat. Nos. 4,107,934 and 4,143,711. The surfaces of the thermal conducting members are maintained in close contact with the respective substrates of the thermoelectric module. Close contact is maintained by disposing and arranging the thermal conducting elements to exert a compressive force upon the opposed faces of the substrates of the thermoelectric module. The compressive force is developed by a pair of bolts that are spaced apart a greater distance than the size of the thermoelectric module, and which operate to apply forces against members with planar surfaces that provide pressing surfaces, for contact with the substrates of the module, that are at least equal to the size of the module's substrates.

It is presently difficult to mount thermoelectric modules between thermal conducting members under compression, in the manner disclosed in the prior art because the substrates of the thermoelectric module are frangible, and when compressional forces are applied to the thermal conducting members, it is often the case that the forces are applied nonuniformly, so that there are developed regions of high pressure upon the faces of the thermoelectric module. Fracture of one or both substrates of the thermoelectric element then frequently occurs during the assembly process, or in operation in the field due to vibration, shock, and temperature changes.

There is, accordingly, need for an improved mounting that regulates the compressional forces applied to the compressing members, and which so locates the applied compressional force to insure that the resulting pressures are distributed over the substrate of the thermoelectric module.

SUMMARY OF THE INVENTION

It is an object of the present invention to provide an improved mounting for a thermoelectric module system which can be easily assembled without fracturing the substrates of the thermoelectric module.

Another object is to apply required optimum pressure to the central portion of the substrate of the thermoelectric module.

A further object is to provide an improved mounting for a thermoelectric module, which is characterized by applying controlled tension and self-leveling pressure to the heat sink which engages the thermoelectric module.

These and other objects, advantages, and features of the invention will become readily apparent from the following detailed description of preferred embodiments, which are presented in conjunction with the accompanying drawings.

BRIEF DESCRIPTION OF THE DRAWINGS

With reference to the accompanying sheets of drawings:

FIG. 8 is a perspective view of an assembly whose cross-section is in accord with the cross-sectional view of FIG. 1, but showing how the heat sink is finned to dissipate heat, and illustrating how the spring-loaded pressure means is located between a pair of fins on the heat sink;

FIG. 9 is an end elevational view of a corner mounted assemblage that utilizes the principles of the invention herein, and wherein the heat sink is a body with a rounded exterior periphery from which radially projecting heat dissipating fins project;

FIG. 10 is a side elevational view of the corner mounted assemblage of FIG. 9; and FIG. 11 is a view similar to FIG. 9 but showing a modified arrangement of heat dissipating fins thereon.

DETAILED DESCRIPTION OF PREFERRED EMBODIMENTS

It will be readily understood from the prior art referred to hereinabove that when the threaded screws are not applying uniform compressive force to the compression plate there is a resultant torque that results in non-uniform pressure being applied to the frangible substrates of the thermoelectric module. Furthermore, strain deformation of the compression plate and heat sink could result in increased pressure being applied upon the edges of the thermoelectric element nearest the threaded screws. As a result of the application of non-uniform pressures, many thermoelectric modules suffer substrate damage during assembly and in field service.

Figure 1:
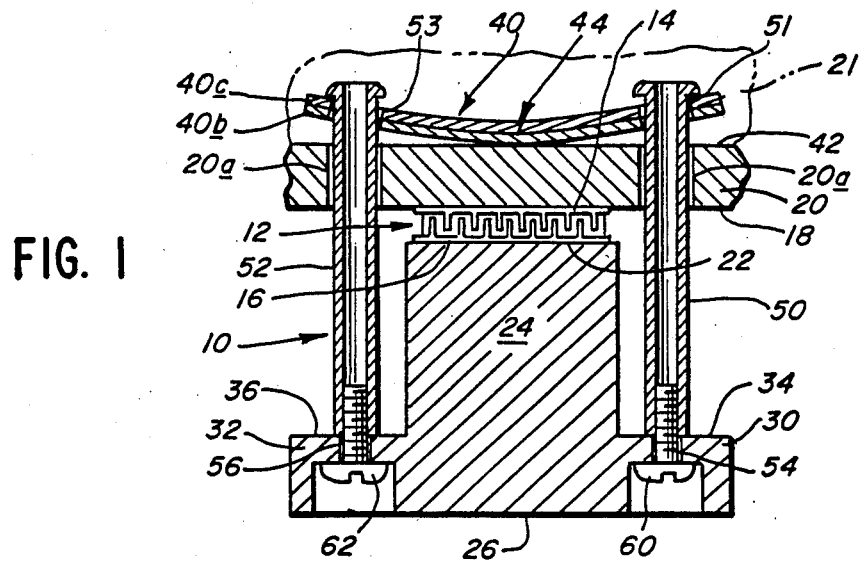
FIG. 1 is a cross-sectional view illustrating one form of the improved mounting for the known Peltier effect thermoelectric module.

As may be seen with reference to FIG. 1, the foregoing difficulties are obviated in a construction incorporating features derived from the present invention. Accordingly, FIG. 1 illustrates a mounting generally indicated at 10 as including a thermoelectric module 12 having substrates 14, 16. Substrate 14 is positioned against a flat surface 18 of one heat conducting member, such as a heat sink, 20. Substrate 16 is positioned against flat surface 22 of another heat conducting member 24.

The second heat conducting member 24 may be constructed in the shape of a block member of smaller cross-sectional area than heat sink 20, and with squared off sides and having opposed transversely projecting flanges 30, 32. The flanges 30, 32 are provided with respective inner faces 34, 36 longitudinally spaced from, and parallel to surface 26 of heat sink 24.

The heat sink 20 is provided with a plurality of heat dissipating fins 21 thereon, spaced from each other to permit free flow of ambient air thereover for heat dissipation. While body 24 is shown as a heat transfer, block shaped, body with attachment flanges 30 and 32, the body 24 may also be provided in the form and shape of a plate.

Figure 2:
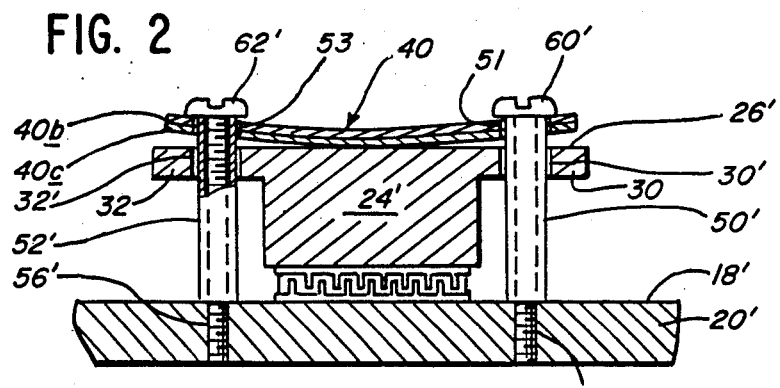
FIG. 2 is a cross-sectional view of another form of improved mounting, for holding a Peltier effect thermoelectric module, that embodies principles derived from the present invention.

In the form of the invention shown in FIG. 1, the pair of assembly bolts do not clamp directly against heat sink 20 as in the pior art. As shown in FIG. 1, an arcuate, or V-shaped, leaf spring 40 is positioned with its central bowed portion 44 engaging a central portion of the surface 42 of the heat sink 20. The surface 42 is parallel to the surface 18. The convexity of the arcuate spring 40 is directed toward the surface 42 to make contact in a small region 44 approximately centered on the surface 42, and so as to be centered above the substrate 14 of module 12. The applying of pressure by bowed portion 44 of spring 40 to plate 20 operates to provide that heat sink 20 floats against the resiliency of spring 40 to provide a spring-loaded, control of pressure that is applied against substrate 14. The leaf spring 40 may be in the form of a single leaf or a plurality of nested leaves as seen in FIGS. 1 and 2.

A pair of headed cylindrical, rigid, internally threaded spacer tubes 50, 52 pass through respective bores 51, 53 in the ends of the leaf spring 40, which bores are coaxial with the respective bores 20a in the thermal conducting member 20, and with the bores or recesses in flanges 30, 32 seen in FIG. 1. The ends of the tubes 50, 52 may be headed, or flanged, as shown, to be of greater dimension than the diameter of the bores 51, 53 in the leaf spring 40, preventing passage of the ends of the tubes through the leaf spring bores. The bores 51, 53 through the leaf springs are each elongated longitudinally of the leaf spring, to prevent binding as the leaf spring flexes relative to the shank of tubes 50, 52.

With the tubes 50, 52 in place, the insides of the tubes are coaxial with bores 54, 56 in respective flanges 30, 32. In this position the axes of tubes 50, 52 are perpendicular to the respective abutment surfaces 34, 36. The outer diameters of the tubes 50, 52 are greater than the diameters of the bores 54, 56. Machine screws 60, 62 adapted to cooperate with the threaded interiors of the respective tubes 50, 52 are inserted from the surface 26 which may be counterbored or recessed, as shown, to receive the screw heads. The opposite ends of tubes 50, 52 may also be threaded to receive screw-type abutments. The length of the tubes 50, 52 are sized so that when the screws 60, 62 are fully tightened, a pre-selected force is applied against the ends of leaf spring 40.

It will be understood that when the ends of leaf spring 40 are under tension, as seen in FIG. 1, the force applied to the face 42 of the heat sink 20, by the apex of leaf-spring 40 bearing against heat sink 20, will be always substantially perpendicular to the planes of the substrates 14, 16 of the thermoelectric module 12. The members 20, 24 are sized and shaped, and the arrangement of V-shaped leaf spring 40, and tensioning means applied to the ends of leaf spring 40 is arranged, so that when the thermoelectric module 12 is in position, between the surfaces 18, 22 the center of the substrate 14 is in position for maximum thermal contact with heat sink 20. Accordingly, the direction of the force exerted by the apex of spring 40 bearing against the heat sink member 20, is always substantially through the central portion of the substrates 14, 16 of the thermoelectric module 12. Because of this arrangement, there are no torques acting upon substrates 14, 16 and the pressure developed, by the bearing of the apex of V-shaped leaf spring 40 against member 20, will be substantially uniformly distributed over the substrate 14. Furthermore, because the only force on the member 20 is exerted near the center of that member, the resulting strain deformation of member 20 will tend to cause the surface 18 of the member 20 to tend to take as lightly convex shape, which will have the effect of relieving, rather than increasing, pressures on the edges of the substrate 14, while simultaneously maximizing heat transfer between the hottest region of the thermoelectric module 12 and the heat sink 20.

It will also be understood that the screws 60, 62 need not be tightened simultaneously, because unsymmetrical tightening of the screws will affect only the amount of force exerted by the apex of leaf spring 40 onto the member 20 toward the center of the thermoelectric module 12, and not the direction of the force. The unit illustrated in FIG. 1 is, therefore, easily assembled because the screws may be independently tightened into the respective tubes as, for example, with a power tool or manually, without fear of damaging the thermoelectric module 12, during assembly, or because of subsequent vibration or shock in operation or in the field.

The length of tubes 50, 52 also provide force limiting means because it is not possible to increase the tension or bending forces on the spring 40 when the tube ends are abutting against the respective surfaces 34, 36.

Accordingly, it may be seen that a construction in accordance with the present invention includes an improved clamping means for a mounting for a thermoelectric module, the module being of the kind having current carrying thermoelectric elements snadwiched between a pair of frangible, planar, parallel substrates, with the thermoelectric module being disposed between spaced heat conducting members 20, 24 with the contact face of each heat conducting member being adapted to be held in snug heat conducting contact with the respective planar parallel substrates of the thermoelectric module by a centrally located compressive force exerted by the clamping means. The improved clamping means comprises, in combination:

limiting means operatively associated with the clamping means for defining the optimum compressive force to be exerted by the clamping means; and leveling means operatively associated with the heat conducting members for maintaining the contact faces of the heat conducting members in parallel relationship to provide substantially uniform pressure against the parallel outer substrate surfaces of the thermoelectric module.

In an alternate construction illustrated in FIG. 2, the first heat conducting member 20', or heat sink, is provided with threaded bores 54', 56'. The flanges 30, 32 of second heat conducting member 24' has through bores 30', 32' which are located co-axially with the bores 54' 56', the bores 30', 32' having greater diameter than the bores 54', 56'. The spring member 40 is placed against the surface 26' of the second member 24'. The tubes 50', 52' pass through the bores 30', 32' in the flanges, but have larger diameter than the bores 54', 56'. Accordingly the tubes 50', 52' are positioned coaxially with the bores 54', 56' but rest against the face 18' of the first conducting member 20'. Elongated threaded stems of screw bolts 60', 62' slidably pass through the tubes 50', 52' and screw into the threaded bores 54', 56'. The lengths of the tubes 50', 52' are sized so that when the screws 60', 62' are tightened equally against the ends of the tubes 50', 52' the spring 40 is placed under predetermined tension.

The spring, or spring means, 40 shown in FIGS. 1 and 2 are shown in the form of a pair of adjacent, or nested, leaves 40b and 40c, with the use of a plurality of leaves providing flexibility in fabrication, and permitting use of thin spring leaves that are easily manufactured.

Figure 3:
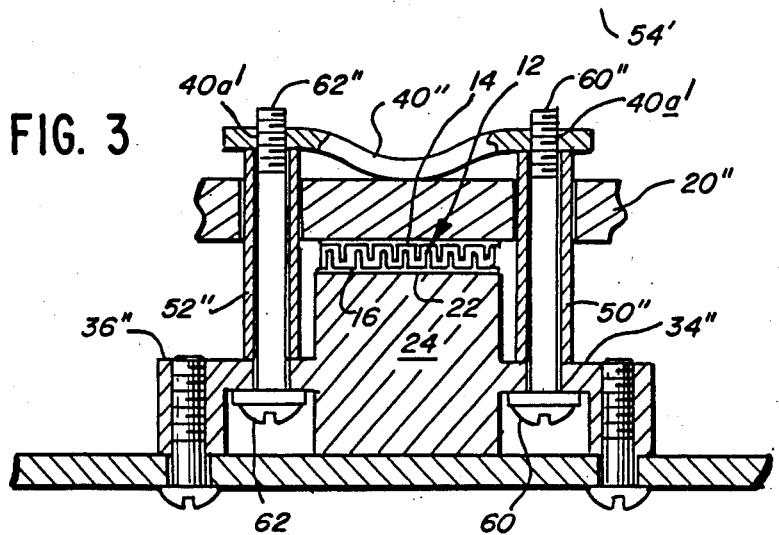
FIG. 3 is a cross-sectional view illustrating an alternate construction of the mounting shown in FIG. 2.

FIG. 3 illustrates a variation of the construction illustrated in FIG. 1 in which the tubes 50, 52 and spring member 40 are replaced by tubes 50'', 52'' and by use of a single spring member 40'', of greater thickness than the individual leaves shown in FIGS. 1 and 2, and with a central offset for bearing against plate 20'' centrally above the thermoelectric module 12''. The tubes 50'', 52'' are sized lengthwise to extend from the surfaces 34, 36 to the position for limiting flexure of the ends of the spring member 40'', as shown in FIG. 3. The bores $40a^1$ in the spring member 40'' are threaded and adapted to receive the threaded ends of long bolts 60'', 62''. Accordingly, as the bolts 60'', 62'' are tightened by threading into the threaded bores in the spring 40'' the ends of the spring 40'' are brought into contact with, and stopped by, the ends of the tubes 50'', 52''.

Figure 4:
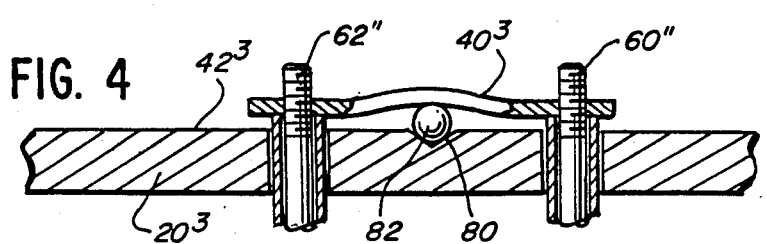
FIG. 4 is a fragmentary view that illustrates a modified form of the mounting shown in FIG. 2.

The construction illustrated in FIG. 4 differs from that of FIG. 3 in that the arcuate spring member 40'' is replaced by a substantially straight spring member $40^3$. A V-shaped dimple 80 in the external surface $42^3$ of first conducting member $20^3$ is positioned between and in line with and equally spaced between the bolts 60'' and 62''. The angle and depth of the dimple 80 is adapted to receive therein a rigid ball 82. When the screws 60'', 62'' are tightened, the spring $40^3$ is deflected by the ball 82 convexly outwardly, as shown, with respect to the surface $42^3$, thereby exerting a compressive force against the ball. It will be appreciated that the ball 82 exerts a force perpendicular to the surface $42^3$ in the same manner that the spring 40 exerts a similar force against the surface 42 in the embodiment of FIG. 1.

Figure 5:
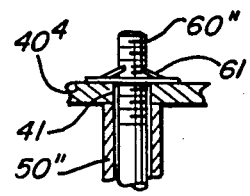
FIGS. 5, 6, 7 illustrate alternate securement means for the ends of the bolts shown in the various forms of assemblage shown herein.
Figure 6:
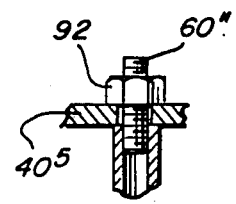
Figure 7:
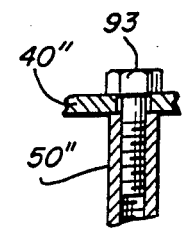

FIGS. 5, 6, and 7 show alternate means for securing the ends of the bolts, 60'', 62'' in the embodiments of FIGS. 3 and 4. Considering, for definiteness, the embodiment of FIG. 3, the spring 40'' may be replaced by a spring $40^4$ having bores 41 which are sized to permit the free passage of the threaded screw 60'' while not permitting passage of the tube 50''. In the construction of FIG. 5 a push-on, locking washer 61 with thread-engaging edges, of the type well known in the art is used for holding the parts assembled. The lock washer is adapted to coact with the end of the screw member 60'', thereby obviating the need to thread the interior of the bore in the leaf spring $40^4$. Alternatively, as illustrated in FIG. 6, a nut 92, with or without a lock washer, may be tightened on the threaded end of the screw 60'' to force the end of the spring $40^5$ into its fully flexed position.

FIG. 7 illustrates another assembly feature, where the spring 40'' is held against the spacing rod 50'' or 52'' on the spring side of the assembly by a headed, threaded bolt member 93 that cooperates with internal threads of the load spacer.

In FIG. 8, the device of FIG. 1 is shown in perspective for disclosing how the heat sink 20 is finned to dissipate heat therefrom. The upper end of body 24 is overlain and concealed by heat sink member 20 so that the thermoelectric module 12 cannot be seen in FIG. 8.

The heat conducting member 20 is shown to be elongated and with a plurality of integral heat dissipating fins 21 on the side of member 20 that is distal from flanges 30 and 32. The lateral spacing between fins 21 may, as shown, be enlarged in the region where the spring means 40 are positioned.

In FIG. 9, a cross sectional view discloses how a heat dissipating device is used at the corners of a box, B, that is used for cooling or heating substances stored therein. A corner fragment of such a box, used in the field for cooling substances such as whole blood, is designated generally at 90. The box, if rectangular, includes a plurality of four corners, each of which includes a pair of elongated box walls 92 and 94 that are joined by a short cornering wall section 96 upon which the heat transfer means are mounted. Typically, the box will have four elongated upright walls, two of which correspond with wall fragments 92 and 94, a bottom $T_1$ and a top $T_2$, suggested in fragment in FIG. 10. One or more corners, and preferably each of the corners of the box is provided with the Peltier type thermoelectric module, one of which is shown in FIGS. 9 and 10, for purposes of cooling the box's interior. Each Peltier module is mounted on the cornering wall 96, so that the fins 104 of the heat sink will be spaced from the walls 92 and 94 of the box.

The heat transfer means includes a thermal transfer member 98, elongated in a direction transverse to the cross-section seen in FIG. 9, which operates to exchange heat with the interior 100 of the enclosed box. If the box is used for refrigerating the box interior, then interior 100 is a cold chamber. The member 98 may be elongated as required by the size of the box, and corresponds to the section 30-24-32 seen in FIG. 8.

The portion 102 of the assemblage in FIG. 9 corresponds in function with the heat sink 20 of FIG. 8, but for purposes of utility, the cross-sectional shape of heat sink 102 is semicircular in cross-section, as seen in FIG. 9, and is elongated, as seen in FIG. 10. To facilitate heat dissipation, the length of heat sink 102 is provided with generally radially extending heat dissipating, or heat transfer, fins 104 that run the length of heat sink 102, as seen in FIG. 10.

The heat sink is held in clamped relation to a Peltier effect thermoelectric module 106, and bolt means 108 and 110, and leaf spring means 112, operate to hold members 98 and 102 in tight heat transfer relation with the module 106, as generally described in connection with the description of FIG. 1 above.

To provide for locating the leaf spring means 112 most desirably relative to heat sink 102 and its heat dissipating fins 104, either the middle portion of middle fin 104a is cut away, centrally, as seen in FIG. 10, or the two most central fins 104b and 104c are arranged in parallel relation, with the spring 112 located between fins 104b and 104c, as seen in FIG. 11. These arrangements provide a central space for locating the spring means 112 nested between the heat dissipating fins 104 of the corner assemblage for the cooling box 90.

It will, of course, be understood that modification of the present invention in its various aspects will be apparent to those skilled in the art, some being apparent only after study and others being a matter of routine design. Further, the use of the particular components and component shapes described herein are not necessary features of the present invention. Accordingly, the scope of the invention should not be limited by the particular embodiment and specific construction herein described, but should be defined only by the appended claims and equivalents thereof.

What is claimed is:

1. In an enclosed multi-edged box whose interior is to be selectively cooled or heated by use of thermoelectric modules of the Peltier type; the provision of at least one short cornering wall section, which joins two principal walls of the box, and a heat transfer unit mounted on the cornering wall section in heat conducting relationship therewith, the heat transfer unit including a first heat conducting member secured to the outside of the cornering wall section, a heat exchange member operatively associated with the first heat conducting member and spaced therefrom; a Peltier type thermoelectric module interposed between said first heat conducting member and the heat exchange member; a pair of elongated clamping means associated with the first heat conducting member and heat exchange member for clamping same against opposite substrates of the thermoelectric module; elongated bowed spring means operatively associated with the pair of clamping means for clamping the heat exchange member in heat conductive relation against one substrate of the module, with the center of the spring means resiliently biasing the heat exchange member against the substrate of the module that engages the heat exchange member; and fin means on the heat exchange member for exchanging heat therefrom with ambient air.

2. A construction as in claim 1 wherein the elongated spring means is V-shaped, with the ends of the spring means operatively associated with said pair of clamping means, and with the central portion of the V-shaped spring means positioned to apply a clamping force through one of the heat conducting members against the adjacent substrate of the module.

3. A construction as in claim 2 wherein a ball member is interposed between the central portion of the elongated spring means and the one of the heat conducting members through which force from the spring means is transmitted against an adjacent substrate of the module.

4. A construction as in claim 1 including a limiting means operatively associated with the clamping means for limiting the amount of clamping force applied by the clamping means against the module.

5. A construction as in claim 4 including leveling means operatively associated with the heat conducting members for maintaining the contact faces of the heat conducting members in abutting relationship to provide substantially uniform pressure against the substrates of the module positioned between the spaced heat conducting members.

6. A construction as in claim 1 wherein the force from the spring means is applied to the adjacent heat conducting member at a point substantially in alignment with the center of the substrates of the module.

7. A construction as in claim 6 wherein a ball member is interposed between the spring means and the adjacent heat conducting member.

8. A construction as in claim 7 wherein the heat conducting member to be pressured has a dimple provided therein to provide a seat for a ball, and a rigid ball member of a size to seat in said dimple and to have the apex, of said elongated spring means, abut against said rigid ball to apply a clamping force through the ball member against the heat conducting member with the dimple therein.

9. In a mounting for a thermoelectric module, of the kind having a current carrying thermoelectric element sandwiched between a pair of spaced, frangible, parallel substrates, the module being disposed between two spaced heat conducting members, each of which respectively abuts one of the substrates of the module in a snug heat conducting contact therewith, clamping means operatively associated with the two heat conducting members for selectively forcing each of the two spaced heat conducting members into a snug heat conducting contact with one of the two substrates of the thermoelectric module, and a pair of elongated clamping means each of which is operatively associated with the two heat conducting members, said clamping means extending transverse to the plane in which the thermoelectric module is operatively positioned between said two heat conducting members;

the improvement comprising, in combination:

an elongated leaf spring means with spaced end portions that are each respectively associated with one of the two clamping means, and with an intermediate portion of the spring means being shaped to be offset from a plane defined by said ends of the elongated leaf spring means, so that said intermediate portion of the spring means provides an offset portion, a ball member through which a clamping force may be applied from the intermediate portion of the spring means and through the ball member to a portion of one of said heat conducting members which abuts one of the substrates of the thermoelectric module, so as to apply a clamping force against the heat conducting member in the direction toward the substrate of said module.

10. In a mounting for a thermoelectric module, of the kind having a current carrying thermoelectric element sandwiched between a pair of spaced, frangible, parallel substrates, the module being disposed between two spaced heat conducting members each of which respectively abuts one of the substrates of the module in a snug heat conducting contact therewith, and assembly bolt means operatively associated with the two heat conducting members for selectively forcing each of the spaced heat conducting members into a snug heat conducting contact with the spaced substrates of the thermoelectric module, said assembly bolt means including a pair of elongated clamp bolt means, each of which is spaced laterally of the thermoelectric module and each being operatively associated with the two heat conducting members, said clamping means each extending transversely to the plane in which the thermoelectric module is operatively positioned between said two heat conducting members;

the improvement comprising, in combination:

an elongated spring member with end portions that are each respectively associated with one of the two clamp bolt means, and with an intermediate portion of the elongated spring member being shaped to be offset from the plane of the ends of the elongated spring member that are associated with the clamping means, so that said intermediate portion of the elongated spring member provides an offset apex that is located and arranged to apply a pressure force against a heat conductive member in a region that is axially aligned with one of the substrates of the module.

11. In a mounting for a thermoelectric module, of the kind having a current carrying thermoelectric element sandwiched between a pair of spaced, frangible, parallel substrates, the module being disposed between two spaced heat conducting members, each of which respectively abuts one of substrates of the module in a snug heat conducting contact therewith, clamping means operatively associated with the two heat conducting members for selectively forcing each of the two spaced heat conducting members into a snug heat conducting contact with one of the two substrates of the thermoelectric module, and a pair of elongated clamping means each of which is operatively associated with the two heat conducting members, said clamping means extending transverse to the plane in which the thermoelectric module is operatively positioned between said two heat conducting members;

the improvement comprising, in combination:

an elongated leaf spring means which spaced end portions that are each respectively associated with one of the two clamping means, and with an intermediate portion of the spring means being shaped to be offset from a plane defined by said ends of the elongated leaf spring means, so that said intermediate portion of the spring means provides an offset apex through which a clamping force may be applied to a portion of one of said heat conducting members which abuts one of the substrates of the thermoelectric module, so as to apply a clamping force against the heat conducting member in the direction toward the substrate of said module.

* * * * *